(12) United States Patent
McMorrow et al.

(10) Patent No.: US 9,136,809 B2
(45) Date of Patent: Sep. 15, 2015

(54) DIGITAL BIAS ADJUSTMENT IN A VARIABLE SUPPLY RADIO FREQUENCY POWER AMPLIFIER

(71) Applicant: Black Sand Technologies, Inc., Austin, TX (US)

(72) Inventors: Robert J. McMorrow, Concord, MA (US); Susanne A. Paul, Austin, TX (US); Aria Eshraghi, Austin, TX (US); Marius Goldenberg, Austin, TX (US)

(73) Assignee: QUALCOMM INCORPORATED, San Diego, CA (US)

( * ) Notice: Subject to any disclaimer, the term of this patent is extended or adjusted under 35 U.S.C. 154(b) by 48 days.

(21) Appl. No.: 14/091,469

(22) Filed: Nov. 27, 2013

(65) Prior Publication Data

US 2014/0152390 A1 Jun. 5, 2014

Related U.S. Application Data

(60) Provisional application No. 61/732,199, filed on Nov. 30, 2012.

(51) Int. Cl.
| | |
|---|---|
| *H03G 3/30* | (2006.01) |
| *H03F 3/68* | (2006.01) |
| *H03F 1/02* | (2006.01) |
| *H03F 3/193* | (2006.01) |
| *H03F 3/21* | (2006.01) |
| *H03F 3/24* | (2006.01) |
| *H03F 3/30* | (2006.01) |

(52) U.S. Cl.
CPC .............. *H03F 3/68* (2013.01); *H03F 1/0261* (2013.01); *H03F 1/0277* (2013.01); *H03F 1/0288* (2013.01); *H03F 3/193* (2013.01); *H03F 3/211* (2013.01); *H03F 3/245* (2013.01); *H03F 3/3022* (2013.01); *H03F 2203/30144* (2013.01)

(58) Field of Classification Search
CPC ..................................... H03G 3/30; H03F 3/20
USPC ................................................... 330/285, 296
See application file for complete search history.

(56) References Cited

U.S. PATENT DOCUMENTS

| | | | |
|---|---|---|---|
| 7,196,584 B2 | 3/2007 | Harris | |
| 7,593,702 B1 * | 9/2009 | Lie et al. | 455/127.2 |
| 8,552,803 B2 | 10/2013 | Sun et al. | |
| 8,791,760 B2 * | 7/2014 | Nadimpalli et al. | 330/296 |

(Continued)

FOREIGN PATENT DOCUMENTS

WO 2011014849 A2 2/2011

*Primary Examiner* — Henry Choe
(74) *Attorney, Agent, or Firm* — Procopio, Cory, Hargreaves & Savitch, LLP

(57) ABSTRACT

An RF power amplifier operates over the range of supply voltages provided by a DC/DC converter whether the range of voltages is intentional or unintentional. A system for digitally adjusting the bias levels relative to the supply voltage includes at least one RF power amplifier stage, a digital control block, and a bias circuit. The RF power amplifier stage has at least one RF input signal, at least one RF output signal, and at least one bias input that controls its bias conditions. The RF Power Amplifier Stage includes one or more active gain elements used to amplify the RF input signals. The RF power amplifier operates in a number of bias states controlled by the digital control block. The digital control block uses information related to the supply voltage and may use other information stored in memory to select the desired bias.

28 Claims, 8 Drawing Sheets

(56) References Cited

U.S. PATENT DOCUMENTS

| | | |
|---|---|---|
| 8,816,775 B2 * | 8/2014 | Annes et al. .................. 330/296 |
| 8,890,617 B2 | 11/2014 | Marra et al. |
| 8,970,307 B2 | 3/2015 | Marra et al. |
| 2011/0025422 A1 | 2/2011 | Marra et al. |
| 2013/0127545 A1 | 5/2013 | Marra et al. |
| 2013/0127546 A1 | 5/2013 | Marra et al. |
| 2014/0266448 A1 | 9/2014 | Cha et al. |

* cited by examiner

DIGITAL BIAS ADJUSTMENT IN A VARIABLE SUPPLY RADIO FREQUENCY POWER AMPLIFIER

CROSS-REFERENCE TO RELATED APPLICATION(S)

This application claims benefit under 35 U.S.C. §119(e) of provisional application 61/732,199 filed Nov. 30, 2012, which application is incorporated herein by reference in its entirety.

BACKGROUND

1. Field of the Invention

This invention generally relates to radio frequency (RF) power amplifiers that operate from a non-constant supply voltage.

2. Description of the Related Art

Wireless handsets are an example of a portable device that often includes one or more such RF power amplifiers. The RF power amplifier (PA) performs the function of amplifying the RF signal from several mili-Watts to powers between 0.5 to 3 Watts. This conditions the signal to a level suitable for transmission by the antenna. The high transmission powers involved require high power to be supplied from the battery. It is desirable to minimize the current that the RF PA draws from the battery so as to prolong battery life. Many methods are used to improve battery current over the range of transmitted powers required during normal operation of a wireless handset. One common technique is to employ a DC/DC converter to reduce the supply voltage provided to the RF PA to a level consistent with the current transmit power level. Wideband Code Division Multiple Access (WCDMA) systems have a specification known as DG09, which breaks the transmitted powers into a probability distribution function. A figure of merit can then be calculated for the battery current during normal operation of a handset. When the handset is transmitting at full power the converter might step up the voltage available from the battery to a larger value or simply pass this value on to the RF PA at a near 1:1 ratio. At lower powers the DC/DC converter converts the available battery voltage to a reduced voltage, where the PA operates with improved efficiency, so that the average current being drawn from the supply is reduced. This latter condition is particularly important since wireless handsets spend a significant portion of their operating time at lower powers levels.

The above is an example where the supply to the PA is purposely varied in order to improve the overall handset system's battery life. In another class of examples undesirable variations in the supply to a PA might be present. For example, battery voltages vary under nominal use between start of life, nominal, and end-of-life and their charging value is often significantly higher than the average. The performance of RF PAs in metrics such as output power, linearity, current, and gain typically varies widely as the supply voltage varies.

SUMMARY

It would be desirable to adapt an RF PA to operate over the range of supply voltages provided by a DC/DC converter in a typical wireless handset system, whether the range of voltages is intentional or unintentional. It would also be desirable to provide controls that allow the PA to operate with highly optimized performance over this entire range of supply voltages and, therefore, to improve DG09 battery current. It would be desirable to adapt an RF PA to operate with near peak performance over the range of supply voltages, provided by a battery in a typical wireless handset system.

In an embodiment, a system for digitally adjusting the bias levels relative to the supply voltage includes at least one RF Power Amplifier Stage, a Digital Control Block, and a Bias Circuit. The RF Power Amplifier Stage has at least one RF input signal, at least one RF output signal, and at least one bias input that controls its bias conditions. The RF Power Amplifier Stage includes one or more active gain elements used to amplify the RF input signals. Each different bias condition that the RF Power Amplifier Stage is designed to operate in is referred to as a bias state. Each different bias state corresponds to a different signal on the bias input. Bias states may include various voltage levels for the gate, drain or source of the RF transistors, various voltages or currents for setting the quiescent current of the RF transistors, current proportional to environmental conditions such as temperature, a variable number of active devices in an RF Power amplifier branch, and/or various tuning and dampening elements such as switched capacitors and resistors.

In an embodiment, the Bias Circuit receives a digital control input from the Digital Control Block and converts this into one or more analog outputs, such as one or more voltages or currents that are coupled to the bias input of the RF Power Amplifier Stage.

In an embodiment, the Digital Control Block receives a digital input and generates a digital control output that controls the Bias Circuit. The Digital Control Block may include an input section to decode the input signal, a memory section for storing information for the bias states, a processing section for preparing the output signal, and a control section for managing the sequence of events. The Digital Control Block processes all of this digital information and selects which of the numerous available bias states are desired for the RF Power Amplifier Stage. The digital input to the Digital Control Block can come from a number of places either outside or within the PA system.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
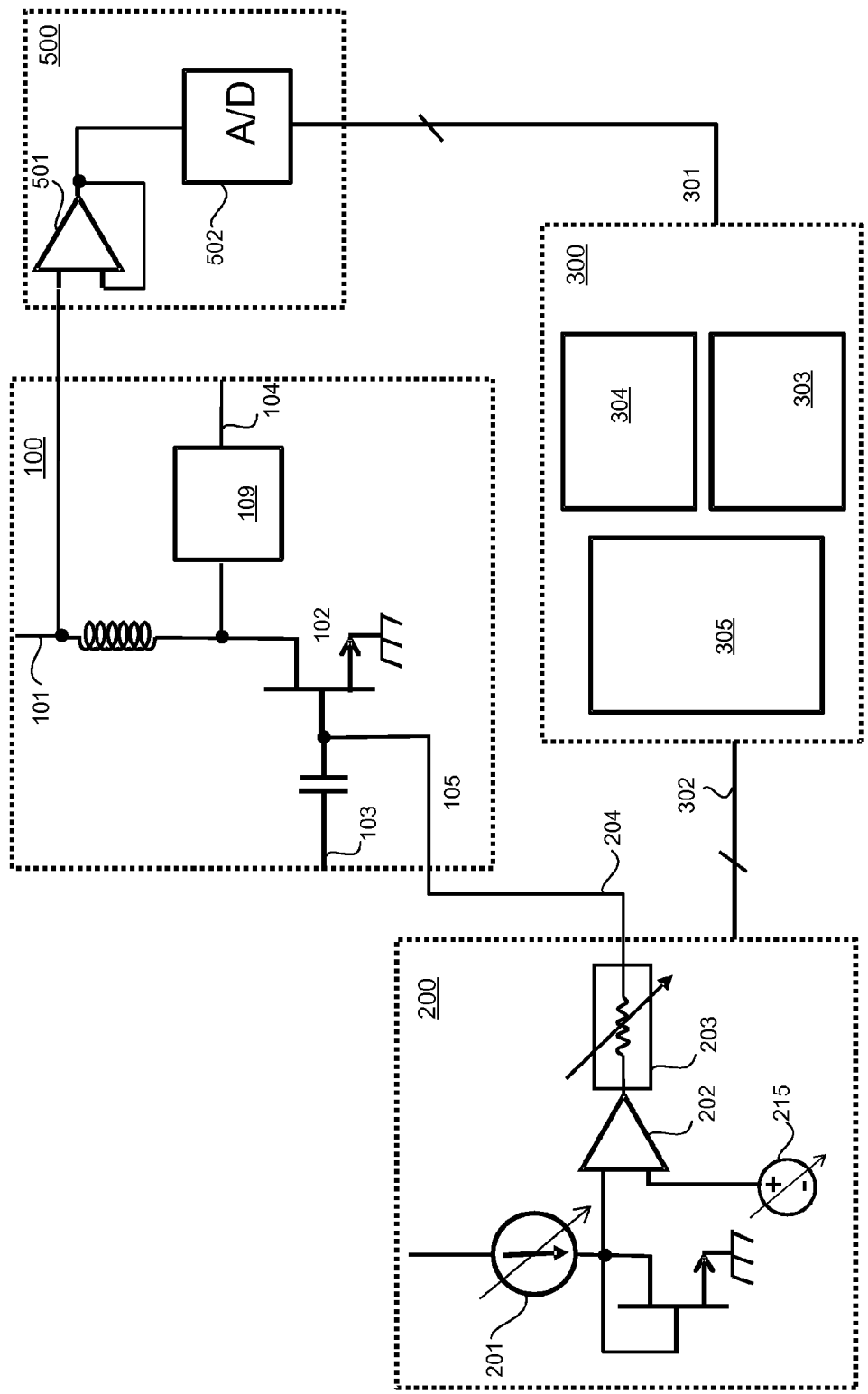
FIG. 1 shows an embodiment with a voltage sensor, whose output controls the selection of a bias state.

An embodiment of the invention is shown in FIG. 1. The embodiment includes an RF Power Amplifier Stage 100, a Bias Circuit 200 a Digital Control Block 300, and a supply voltage sensor 500.

The RF Power Amplifier Stage 100 includes a variable supply terminal 101, for powering the one or more active gain elements 102 for amplifying an RF input signal, an RF input signal 103, an RF output signal 104, one or more bias inputs that controls the stage's bias conditions 105, and a matching network 109 to provide impedance transformation, e.g., to convert relatively high load impedance (not shown in FIG. 1) into a lower impedance as seen by the output from gain elements 102. Each different bias condition that the RF Power Amplifier Stage is designed to operate in is referred to as a bias state. Each different bias state corresponds to a different signal on the bias input 105. Bias states may differ from one another by the various voltage levels that are present on the gate, drain, or source of the active gain elements. They may also differ from one another by the various voltages or currents that set the quiescent current of each active gain element. Bias states may differ in terms of the number of gain elements that are active in the stage. Different bias states may have different tunings or impedances within the stage's input or output matching circuits and these may be chosen by engaging switched capacitors or resistors or by controlling varactors.

The active gain element 102 has been drawn as a Field Effect Transistor (FET) in the drawing but can be replaced with any of the technologies used for RF amplification including but not limited to Si BJT, CMOS, LDMOS, GaAs FET, GaAS HBT, GaN FET, and SiGe BJT. The RF Power Amplifier Stage was drawn with a single transistor for simplicity but may be constructed using multiple active devices to form any of the common amplifier topologies and classes of operation, including but not limited to differential, push-pull, Darlington, and stacked. The amplifier stage has been drawn to show the variable supply coupled to the transistor through an inductor and the input coupled to the transistor through a capacitor. Alternate configurations of reactive and resistive elements to add filtering and impedance matching can be used as well and are known to those skilled in the art.

The Bias Circuit 200 converts a digital control input 302 into the analog signals that are required to implement the designated bias state in the RF Power Amplifier Stage 100. In the embodiment of FIG. 1, the Bias circuit 200 includes a variable current generator 201, an output buffer and level shifter 202, and a variable output resistor 203. The output buffer and level shifter 202 may be coupled to a variable voltage supply 215. These elements in various combinations are capable of implementing multiple bias states. The digital control input 302 may be a serial or parallel combination of digital information. The variable current generator 201 can be set to provide one of a number of discrete current levels. The current generator might also be set to provide a current that is proportional to absolute temperature (PTAT), have zero proportionality to absolute temperature (ZTAT), complementary to absolute temperature (CTAT), or be set to any to have any other proportion to an environmental condition. The output buffer 202 may have a bandwidth that is adjustable in discrete steps, and have a number of adjustable offset voltages. The variable output resistor, 203 can be set to a number of discrete values to change the output impedance for the bias circuit.

As an example of some bias states, a first bias state may have a PTAT reference current of 20 uA, and offset of 0V, and a bias resistance of 1 k-Ohm. A second bias state may have a second PTAT reference current of 40 uA, and offset of 20 mV, and a bias resistance of 5 k-Ohms. The digital control input is used to select one of these two states. The Bias Circuit implements the currents and voltages accordingly. The output of the Bias Circuit is the analog bias voltage 204 that is sent to the RF Power Amplifier Stage.

The Digital Control Block 300 uses a combination of the supply voltage and other information stored in memory to select the desired bias state. It has a digital sense input 301 and a digital output 302 that specifies the bias state that is selected. It includes an input section 303, a memory section 304, and a processing section 305. The broader Digital Control Block manages the sequence of operations between these sections. The digital sense input can be any combination of serial and parallel bits and may conform to one of the standard digital communication formats. The input section is used to decode the input information so that it can be used internally. For example, the input section might extract the relevant bits from a serial bit-stream and convert to parallel information. The memory section 304 may be used to store information that aids in the selection process. For example, the memory section might store bias settings that have been predetermined to be used at a number of supply voltages. The memory section might include one-time programmable (OTP) flash RAM, or static RAM, or other memory cells. The memory settings may be fixed based on the design of the product, set during calibration, or be reprogrammed during operation. The processing section includes logic that takes signals from the input section and from the memory section and calculates which of the available bias states is desired based on those signals. The processing may include digital signal processing to aid with the selection of bias states versus supply voltage. The information about which of the bias states has been selected is contained in the digital output 302 that controls the Bias Circuit.

The supply sensor 500 detects the voltage of the variable supply 101 provided to the RF Power Amplifier Stage and converts it to digital information. It may include a buffer 501, and an Analog-to-Digital Converter 502.

The operation for the embodiment shown in FIG. 1 is as follows. The level of the supply voltage is detected by the supply sensor 500, and is provided in digital form to the Digital Control Block 300. The processing block 305 receives a decoded version of the supply voltage and receives information from memory and selects the desired bias state from these. It sends this control information to Bias Block 200, which implements the selected bias state by changing the analog control signals it sends to the RF Power Amplifier Stage.

As further illustration of the operation of the embodiment in FIG. 1, consider an example where the supply for the RF Power Amplifier changes from 3.4V to 2.0V. The bias conditions that result in optimum performance of the RF Power Amplifier Stage are different for these different supply voltages. The Digital Control Block notices the reduction in supply voltage and determines from memory that the quiescent bias current of the RF amplifier stage should be lowered to a predetermined value, that the bandwidth of the bias circuit should be changed, and that the relationship to temperature should change from PTAT to ZTAT. Changes like these to operation of the RF Amplifier Stage can be implemented for any number of different supply voltages.

Figure 2:
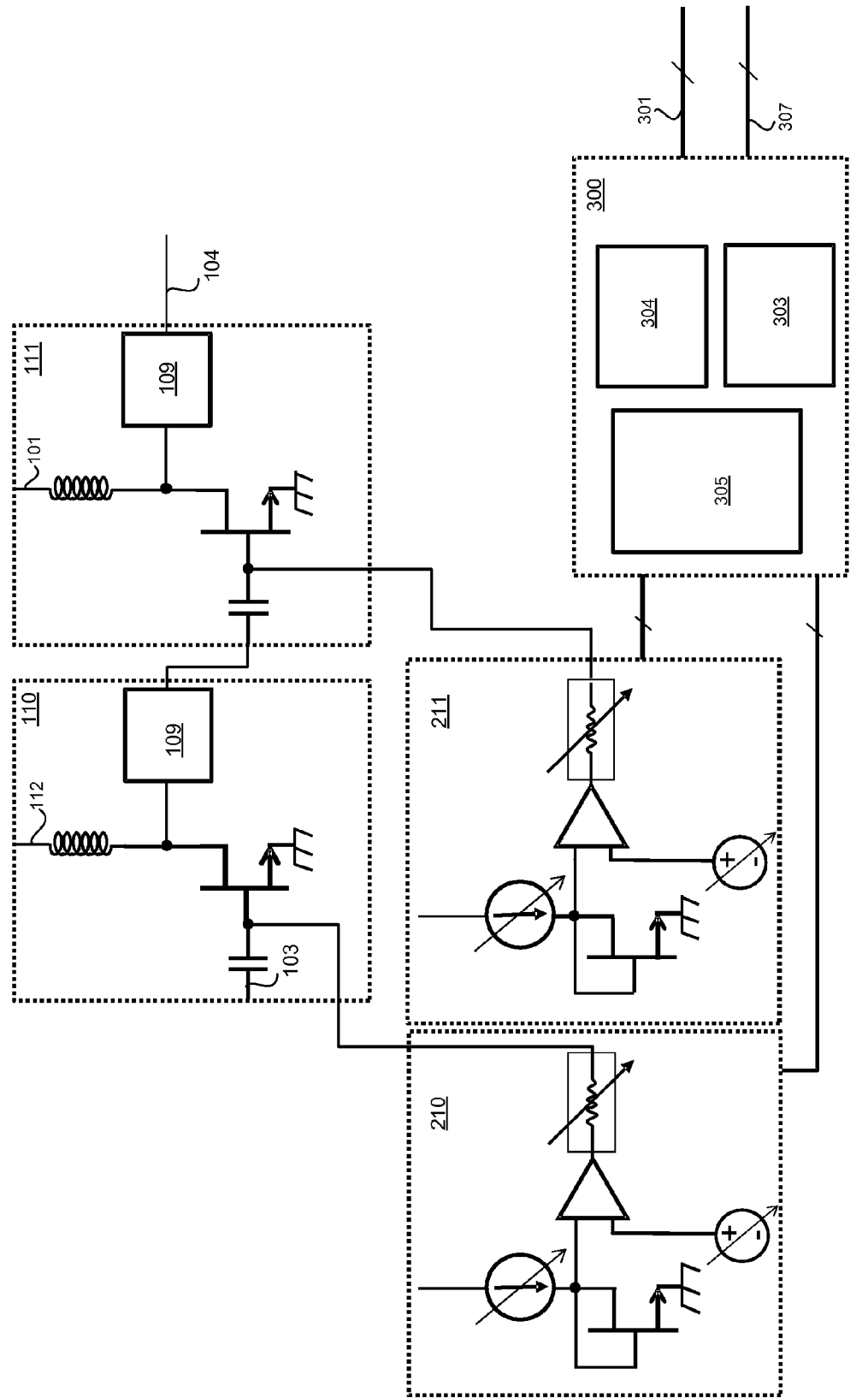
FIG. 2 shows an embodiment with multiple sequential RF Power Amplifier stages and with a separate Bias Circuit associated with each RF Power Amplifier Stage.

FIG. 2 shows an embodiment that contains two RF Power Amplifier Stages, predriver stage 110 and output stage 111, configured in series. Predriver stage 110 includes its own Bias Circuit, 210, and output stage 111 includes its own Bias Circuit, 211. Predriver stage 110 includes a variable supply bias 112, and output stage 111, includes a second variable supply voltage 101. Variable supply biases 101 and 112 may be completely independent supplies. Alternatively a single variable supply might be used for both 101 and 112, a fixed bias for terminal 101 with a variable supply for 112, or a fixed voltage for terminal 112 and a variable supply for 101. A single Digital Control Block 300 controls both of these Bias Circuits. Digital Control Block 300 includes a second digital input sensor 307 used to deliver information about the second variable supply 112. Digital sensor inputs 301 and 307 may be independent controls that interface with separate voltage sensors, or may be combined as separate digital information in a single bit stream. Controlling bias changes across multiple stages in response to changes in the supply voltage makes it possible to control the amplitude modulated—amplitude modulated (AM-AM) distortion and the amplitude modulated—phase modulated (AM-PM) distortion for the overall power amplifier. AM-AM distortion refers to the extent that a change in the input amplitude is not properly reflected in the output amplitude. AM-PM distortion refers to the extent that a change in input amplitude is improperly reflected in the output phase. Controlling bias also adds more degrees of freedom to allow optimization of efficiency, linearity, and saturated output power over the entire range of the variable supply voltage. At higher supply voltages a larger quiescent current may be selected so as to improve the linearity and allow operation at higher power levels. At lower supply voltages full power is not possible so a smaller quiescent current can be chosen to optimize the overall power consumption.

Figure 3:
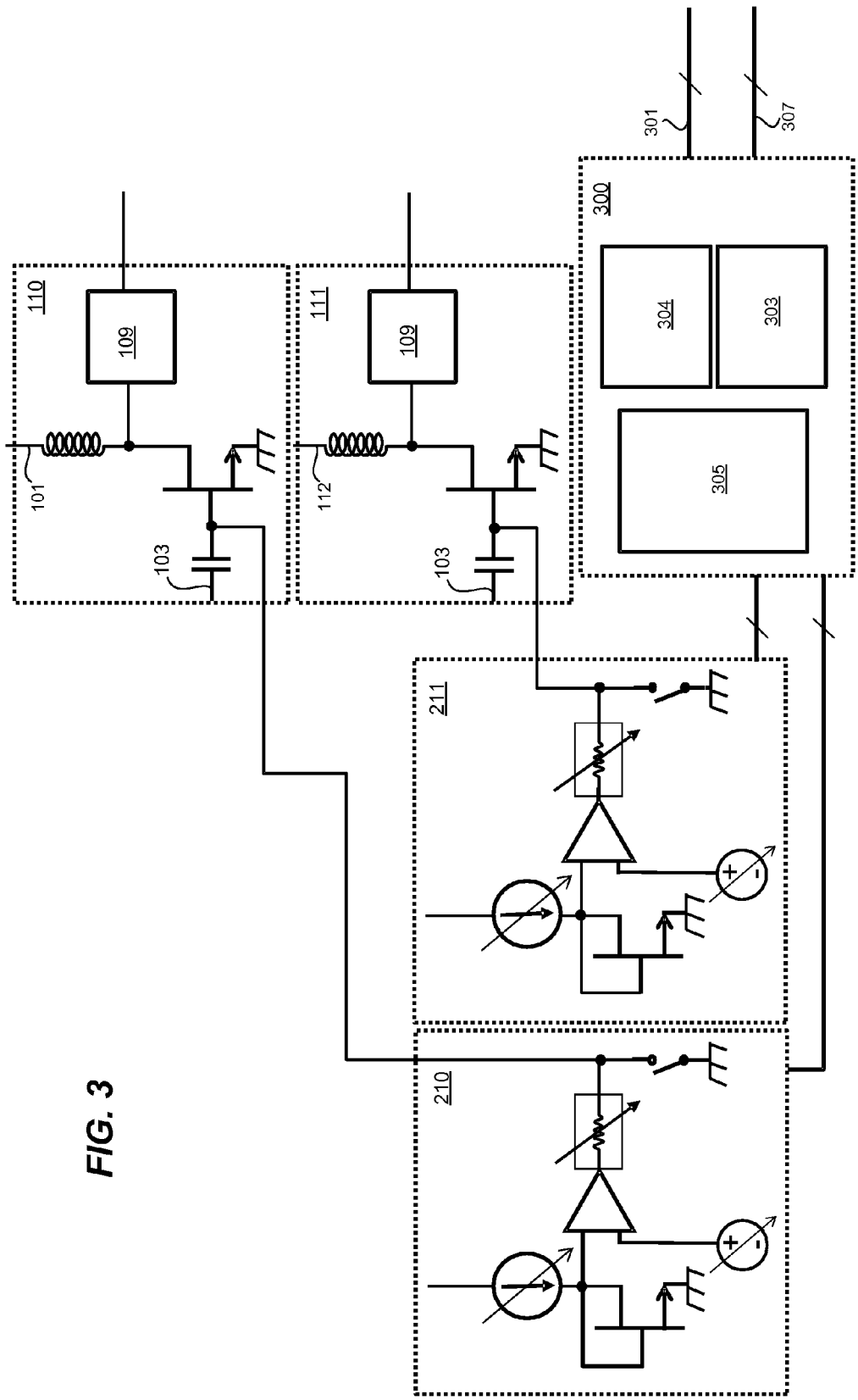
FIG. 3 shows an embodiment with multiple parallel RF Power Amplifier Stages and with a separate Bias Circuit associated with each RF Power Amplifier Stage.

FIG. 3 shows an embodiment that contains two RF Power Amplifier Stages, 110 and 111, configured in parallel. Stage 110 has its own Bias Circuit 210 and stage 111 has its own Bias Circuit 211. Predriver stage 110 includes a variable supply bias 101, and output stage 111 includes a second variable supply voltage 112. A common example that includes parallel Power Amplifier Stages is that of a differential amplifier, where the two stages form the two differential halves of the amplifier and where their outputs are coupled together to drive a load. An embodiment allows for separate bias control of the two halves. A parallel arrangement might also be used to form an amplifier topology such as a balanced amplifier or a Doherty amplifier.

Figure 4:
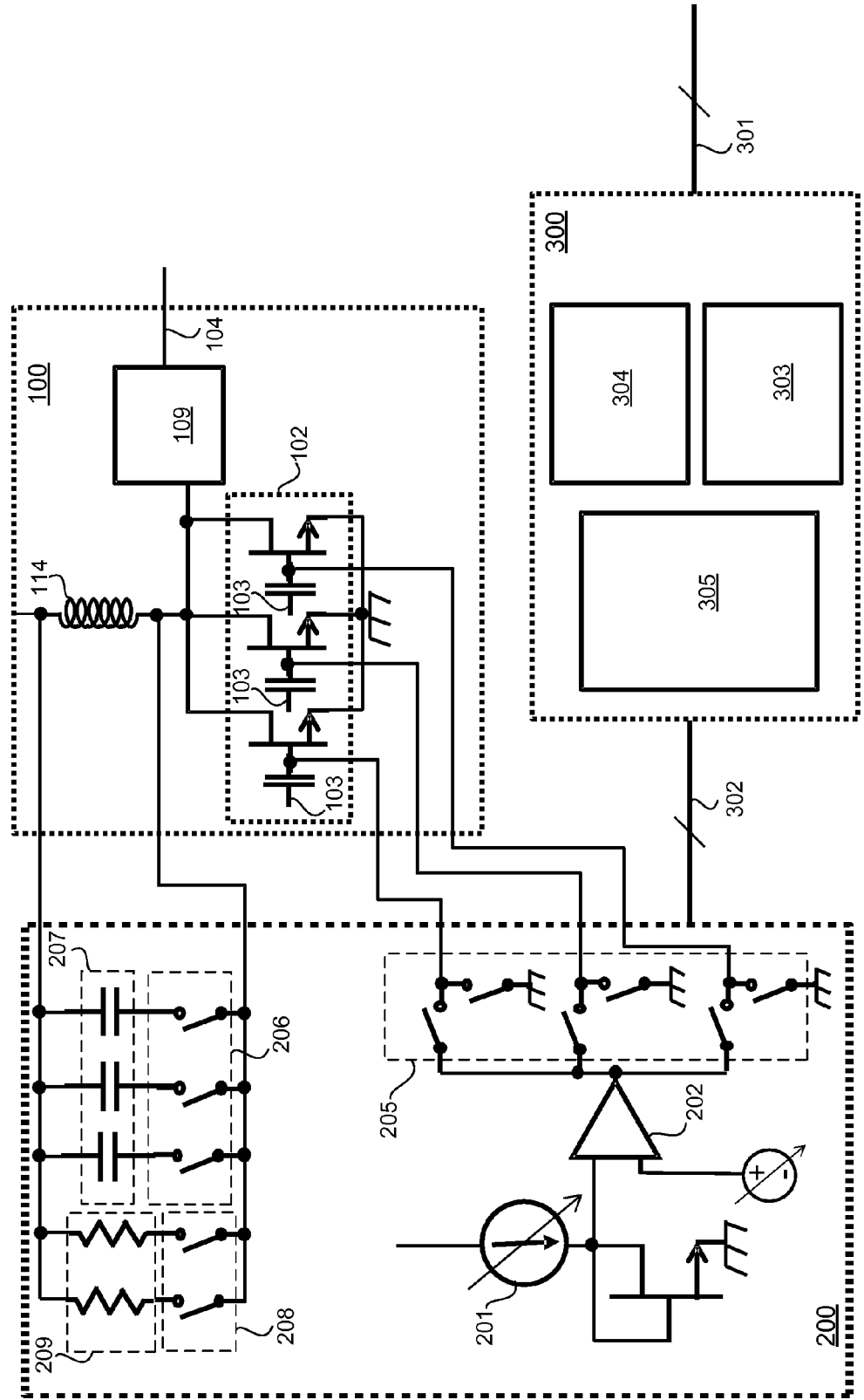
FIG. 4 shows a bias block embodiment that includes switchable capacitors for tuning the output match of the RF Power Amplifier Stage and also includes switchable bias for selecting the number of transistor devices that are active within the RF Power Amplifier Stage.

The Bias Circuit 200 of the embodiment in FIG. 4 alters the output match, the gain, and the quiescent current of the RF Amplifier Stage 100. Switches 206 allow each of the parallel capacitors in capacitor bank 207 to be either connected in parallel with inductor 114 or disconnected from inductor 114. This varying capacitance value changes the resonant frequency of the RF Power Amplifier Stage's output match. Switches 208 selectively activate a bank of resistors 209, which can be used to change the damping factor for the L-C tank. RF transistor 102 has been divided into unit transistor elements, each with its own gate. The gates are coupled to the Bias Circuit through switches 205, which either bias each individual gate in an on position or tie it to ground in an off position. In this way different numbers of these unit transistor elements are made active and the effective size of the RF transistor is changed.

Figure 5:
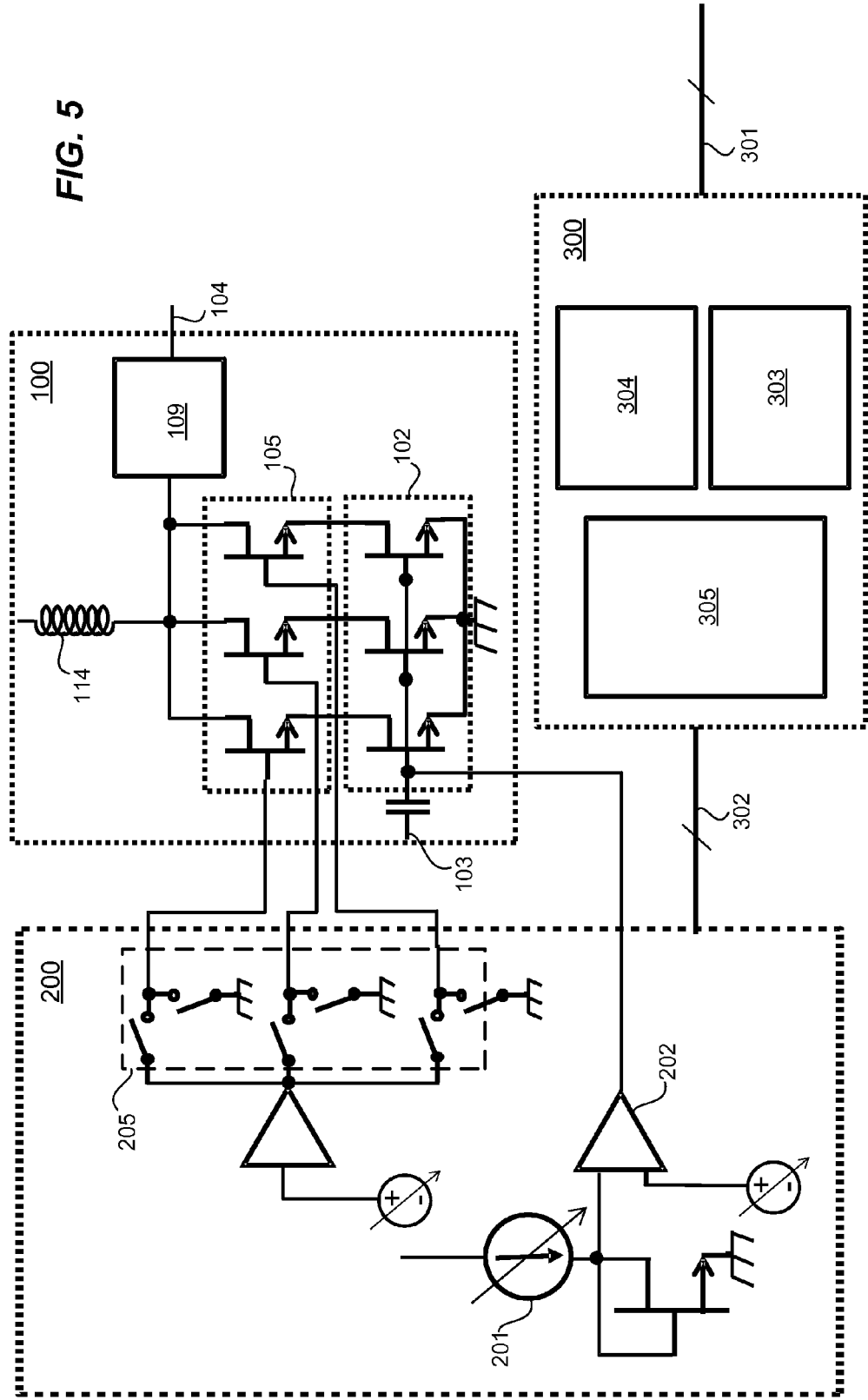
FIG. 5 shows a bias block embodiment that includes switchable bias for selecting the number of transistor devices that are active within the RF Power Amplifier Stage.

FIG. 5 shows an alternate way to change the effective size of RF transistor 102. In this embodiment transistor 102 is divided into unit transistor elements each with its own drain. Each of these drains is connected in series with a cascode device that is a segment of 105. Each unit element of transistor 102 is enabled by turning on the gate of its corresponding cascode device segment 105. The gates of cascodes 105 are activated by turning on the series switch and turning off the shunt switch in switch bank 205. The gates of cascodes 105 are alternatively deactivated by turning the series switch off and the shunt switch on in switch bank 205. The latter effectively connects the gate of the deactivated cascode to ground. The total number of unit elements that are enabled determines the effective size of the RF transistor and the gain and quiescent current of the RF Power Amplifier Stage.

Figure 6:
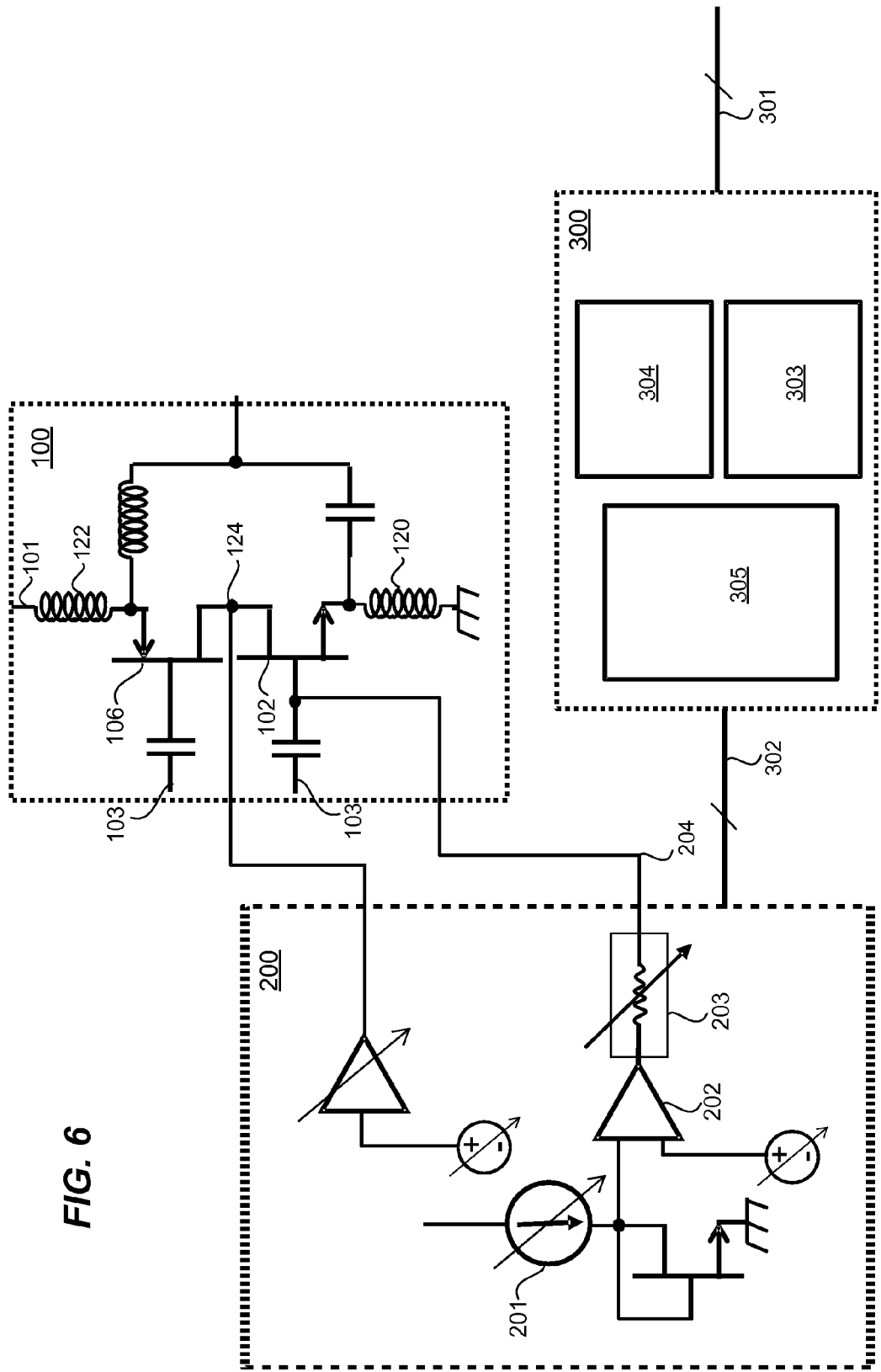
FIG. 6 shows a stacked RF Power Amplifier Stage and a Bias Circuit that adjusts its mid-point voltage.

FIG. 6 shows an embodiment where the RF amplifier stage 100 is a stacked arrangement of source followers. NMOS transistor 102 has an inductor 120 coupled between the source and ground. The source of transistor 102 is now used as the output. PMOS transistor 106 has an inductor 122 between its source and the variable supply voltage 101. The output of transistor 106 is taken from the source. Transistors 102 and 106 are coupled at the drains and "stacked" in series with the supply. It is desirable to keep the mid-point 124 where the drains of transistors 102 and 106 meet at a fixed ratio of the variable supply voltage. Bias circuit 200 includes a variable output buffer 212 that is configured to control the mid-point voltage relative to a change in the variable supply voltage. The output of the RF amplifier stage is shown to be a combination of the source of transistor 102, coupled through a high pass filter, and the source of transistor 106, coupled through a low-pass filter. This arrangement can ensure the outputs of the two devices are combined in phase. The RF amplifier stage may also be configured to have two outputs, one for each of the two sources. Many other topologies known in the art may be employed to combine the two outputs.

Figure 7:
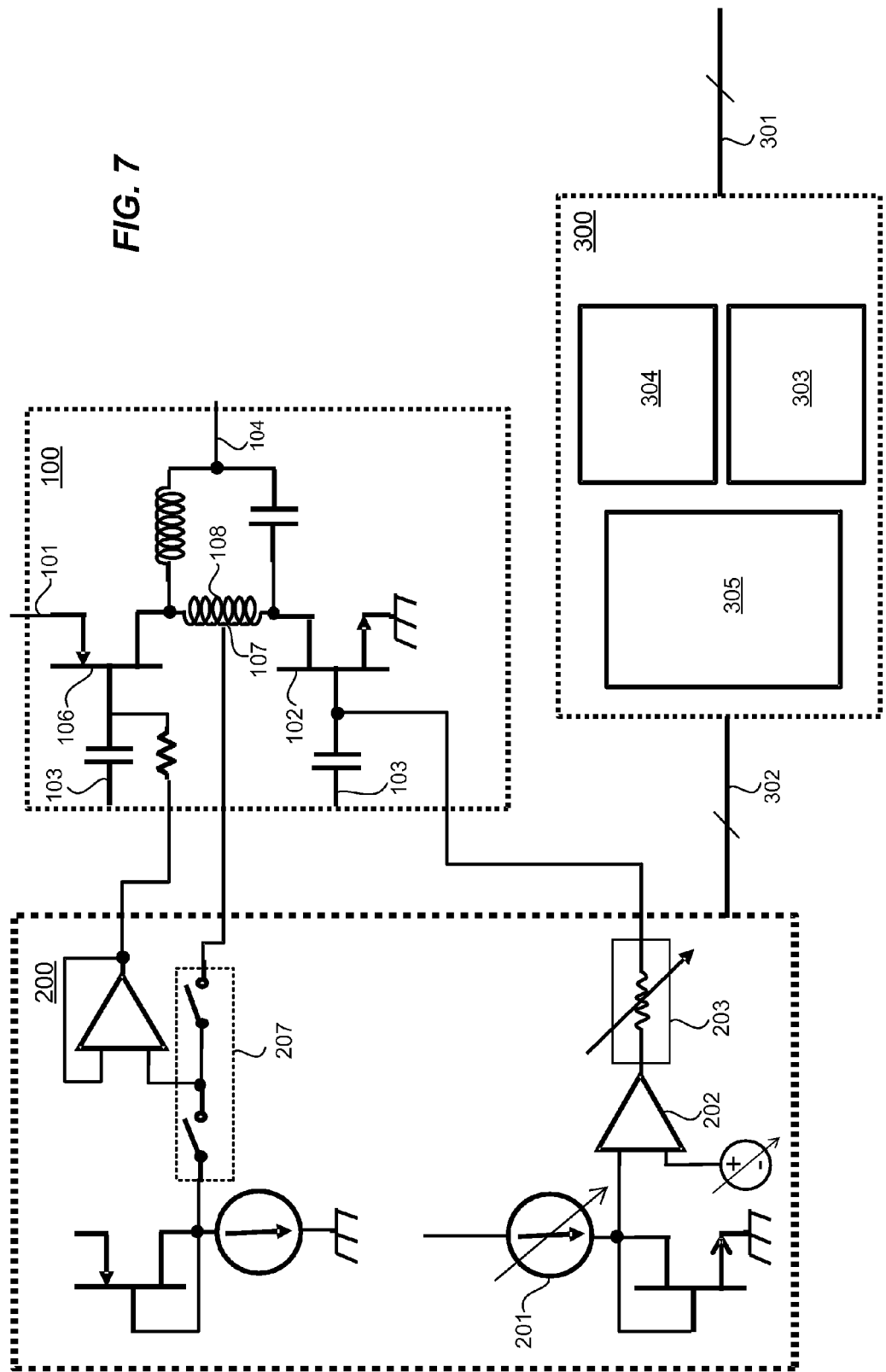
FIG. 7 shows an embodiment with a stacked RF Power Amplifier Stage and a Bias Circuit that adjusts its mid-point voltage.

FIG. 7 shows an alternate embodiment where RF amplifier stage 100 is configured in a stacked arrangement. NMOS transistor 102 has the source coupled to ground and is configured as a common source amplifier. PMOS transistor 106 has the source coupled to the variable supply voltage 101. The drains of transistors 102 and 106 are coupled through an inductor 108. Inductor 108 can be made large so as to serve as an AC choke allowing the drain voltage for each transistor to operate in isolation from the other. Inductor 108 includes a connection 107 at the center point to sense and/or control the DC bias voltage. Switches 207 are used to select the bias method for PMOS transistor, 106. When the left switch is operable a conventional bias approach using a current mirror is selected. When the switch on the right is operable the gate voltage tracks the mid-point voltage 107 and the current tracks the bias for the NMOS transistor.

Figure 8:
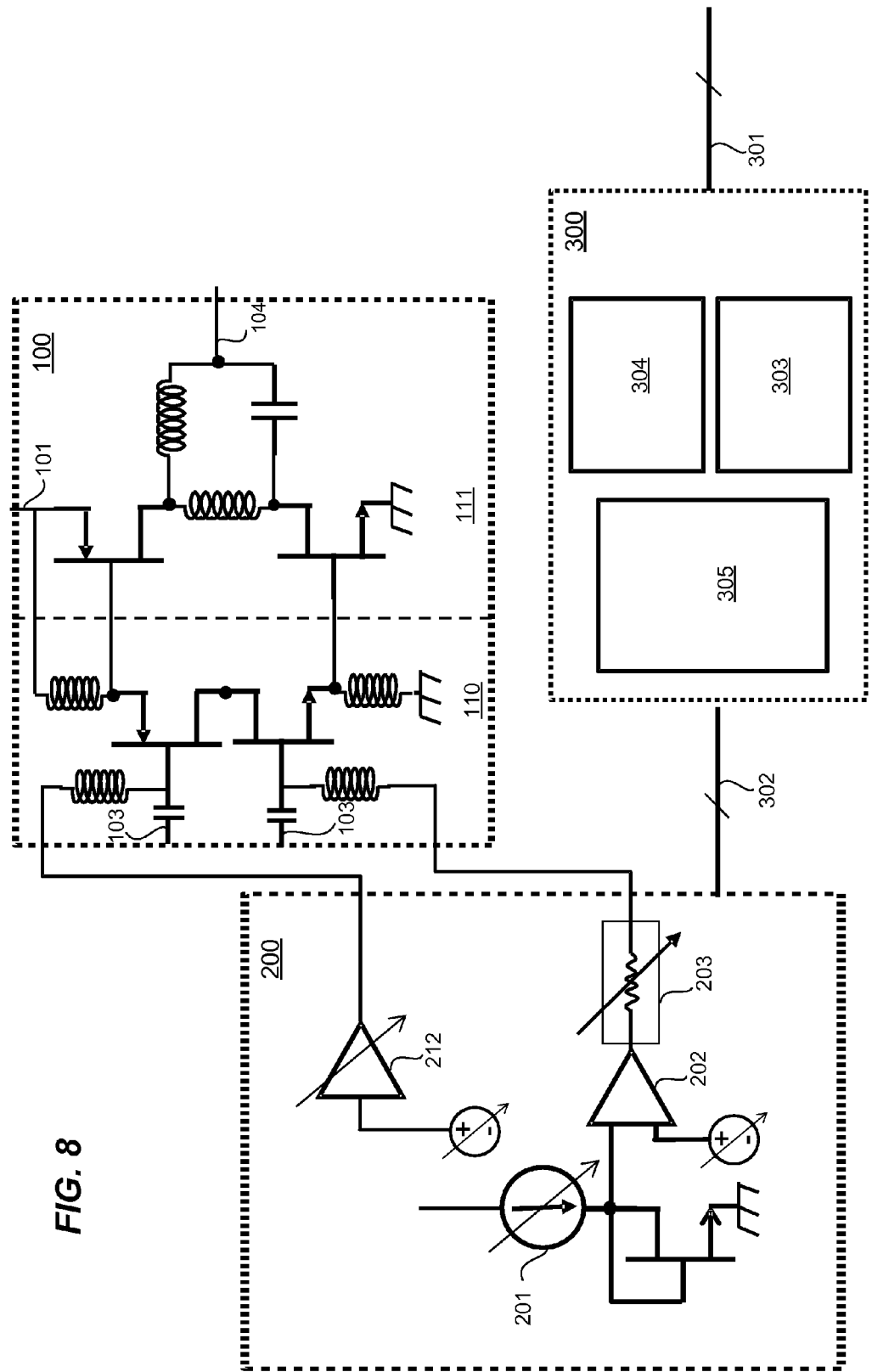
FIG. 8 shows an embodiment with a darlington-style RF Power Amplifier Stage and a Bias Circuit that adjusts its mid-point voltage The use of the same reference symbols in different drawings indicates similar or identical items.

FIG. 8 shows an alternate embodiment. In this embodiment the supply sensor 500 has been removed. The digital sense input 301 can be controlled independently from elsewhere in the system. This arrangement might be useful in the case where a supply sensor is already employed for other reasons and the information can be made available to the RF power amplifier. The system may also employ a DC/DC converter to control the variable supply voltage. Synchronized information about the chosen supply voltage can then be sent to the RF power amplifier directly via the digital sense input 301.

Also shown in FIG. 8 is a two-stage arrangement for a stacked RF amplifier stage 100. The stacked source follower stage 110 described in FIG. 6 is coupled in series with the stacked common source amplifier 111 described in FIG. 7. This arrangement combines elements from the embodiments of FIGS. 2, 6, and 7 and demonstrates one of many topologies than can be made using the descriptions herein.

Thus, embodiments have been described capable better handling the range of supply voltages supplied to an RF PA. The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A radio frequency (RF) power amplifier comprising:
an RF amplifier stage coupled to receive an RF input signal and supply an RF output signal, the RF amplifier stage including one or more active gain elements to amplify the RF input signal, the RF amplifier stage being further coupled to a variable supply voltage and to one or more bias signals to set a bias state for the RF amplifier stage;
a bias circuit coupled to receive a control input specifying the bias state, the bias circuit coupled to supply the one or more bias signals to the RF amplifier stage, operation of the RF amplifier stage being varied in response to change in the bias state;
a sense circuit coupled to the variable supply voltage, the sense circuit operable to produce a digital representation of the variable supply voltage and supply the digital representation as a digital sense input; and
a digital control block coupled to receive the digital sense input representing the variable supply voltage, the digital control block operable to determine the bias state for the RF amplifier stage responsive to the digital sense input, the bias state varying according to the variable supply voltage, the digital control block coupled to the bias circuit to provide the control input.

2. The RF power amplifier of claim 1, wherein the operation of said RF amplifier stage is varied by changing the quiescent current of said RF amplifier stage according to the one or more bias signals.

3. The RF power amplifier of claim 1, wherein the operation of said RF amplifier stage is varied by changing voltage levels within said RF amplifier stage according to the one or more bias signals.

4. The RF power amplifier of claim 1 wherein said one or more active gain elements includes a transistor with multiple transistor elements and wherein the operation of said RF amplifier stage is varied by changing a number of said transistor elements that are active according to the one or more bias signals.

5. The RF power amplifier of claim 1 wherein the operation of said RF amplifier stage is varied by connecting a variable reactance to nodes within said RF amplifier stage according to the one or more bias signals.

6. The RF power amplifier of claim 1 wherein the operation of said RF amplifier stage is varied by connecting a variable resistance to nodes within said RF amplifier stage according to the one or more bias signals.

7. The RF power amplifier of claim 1 wherein the operation of said RF amplifier stage is varied by changing the bias state responsive to environmental conditions.

8. The RF power amplifier of claim 1 wherein said RF amplifier stage and said bias circuit are integrated in a single CMOS die.

9. The RF power amplifier of claim 1 wherein said RF amplifier stage comprises two or more stacked amplifiers.

10. The RF power amplifier of claim 1 wherein respective bias states are chosen to provide improved linearity of the RF power amplifier stage at a given level of said variable supply voltage as compared to other bias states.

11. The RF power amplifier of claim 1 wherein respective bias states are chosen to provide improved current consumption of the RF power amplifier stage at a given level of said variable supply voltage as compared to other bias states.

12. The RF power amplifier of claim 1 wherein at some levels of said variable supply voltage respective bias states are chosen to provide improved linearity of the RF power amplifier stage as compared to other bias states and at other levels of said variable supply voltage respective bias states are chosen to provide improved current consumption of the RF power amplifier stage as compared to other bias states.

13. The RF power amplifier of claim 1 wherein said digital control block includes digital memory to store information about selection of bias states versus supply voltage.

14. The RF power amplifier of claim 1 wherein said digital sense input comes from a circuit external to the RF power amplifier.

15. The RF power amplifier of claim 1 further comprising:
a second RF amplifier stage coupled to receive a second variable supply voltage and to receive one or more second bias signals to set a second bias state of the second RF amplifier stage, the second RF amplifier stage providing a second RF output signal;
a second bias circuit responsive to a second control input to supply the second bias signal;
wherein the digital control block is coupled to receive a second digital sense input representative of said second variable supply voltage, the digital control block responsive to the second digital sense input to determine the second control signal corresponding to said second bias state, the second control signal being varied in response to variation in said second variable supply voltage.

16. The RF power amplifier of claim 15 wherein said RF amplifier stage and said second RF amplifier stage are connected in series with the RF output signal of the RF amplifier stage coupled to an RF input of the second RF amplifier stage.

17. The RF power amplifier of claim 15 wherein said RF amplifier stage and said second RF amplifier stage are connected in parallel with the RF output signal and the second RF output signal coupled together to drive a load.

18. The RF power amplifier of claim 15 wherein said first and second variable supply voltages are the same and wherein said first and second digital sense inputs are the same.

19. The RF power amplifier of claim 15 wherein said RF amplifier stage and said second RF amplifier stages comprise separate stacked amplifier stages.

20. A method of changing the operation of an RF power amplifier in response to changes in its variable supply voltage comprising:
sensing the variable supply voltage and generating a digital signal as a digital sense input;
receiving the digital sense input that is representative of the variable supply voltage;
selecting a bias state for an RF amplifier stage based at least in part on the digital sense input and producing a control signal that is representative of the selected bias state;
generating an analog bias signal in response to said control signal, said analog bias signal operable to implement the selected bias state in the RF amplifier stage;
wherein change from a current bias state to the selected bias state results in change in operation of the RF amplifier stage.

21. The method of claim 20 wherein operation of the RF power amplifier is changed in order to optimize linearity at each variable supply voltage.

22. The method of claim 20 wherein operation of the RF power amplifier is changed in order to optimize current consumption at each variable supply voltage.

23. The method of claim 20 wherein operation of the RF power amplifier is changed in order to optimize linearity at some values of the variable supply voltage and in order to optimize current consumption at other values of the variable supply voltage.

24. The method of claim 20 further comprising varying the operation of said RF amplifier stage by changing the quiescent current of said RF amplifier stage.

25. The method of claim 20 further comprising varying the operation of said RF amplifier stage by changing voltages within said RF amplifier stage.

26. The method of claim 20 further comprising varying the operation of said RF amplifier stage by changing a number of transistor elements that are active within said RF amplifier stage.

27. The method of claim 20 further comprising varying the operation of said RF amplifier stage by changing reactive impedances within said RF amplifier stage.

28. The method of claim 20 further comprising varying the operation of said RF amplifier stage by coupling a variable resistance to nodes within said RF amplifier stage.

* * * * *